US012560660B2

(12) United States Patent
Chang et al.

(10) Patent No.: US 12,560,660 B2
(45) Date of Patent: Feb. 24, 2026

(54) PANEL INSPECTION APPARATUS

(71) Applicant: Samsung Display Co., LTD., Yongin-si (KR)

(72) Inventors: Woong-Jae Chang, Yongin-si (KR); Sorim Park, Yongin-si (KR); Hee Dok Choi, Yongin-si (KR); Youngmyo Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 281 days.

(21) Appl. No.: 18/527,798

(22) Filed: Dec. 4, 2023

(65) Prior Publication Data

US 2024/0337706 A1      Oct. 10, 2024

(30) Foreign Application Priority Data

Apr. 7, 2023      (KR) ......................... 10-2023-0046297

(51) Int. Cl.
| | |
|---|---|
| *G01R 31/66* | (2020.01) |
| *B08B 13/00* | (2006.01) |
| *G01M 11/00* | (2006.01) |

(52) U.S. Cl.
CPC .............. *G01R 31/66* (2020.01); *B08B 13/00* (2013.01); *G01M 11/00* (2013.01)

(58) Field of Classification Search
CPC .... G01R 31/66; G01R 31/2808; B08B 13/00; B08B 5/043; G01M 11/00; G01M 99/007
See application file for complete search history.

(56) References Cited

FOREIGN PATENT DOCUMENTS

| | | | | |
|---|---|---|---|---|
| CN | 112763185 A | * | 5/2021 | ........ G01M 11/0207 |
| JP | 2006301633 A | * | 11/2006 | |
| JP | 2016-148548 | | 8/2016 | |
| KR | 10-0568111 | | 4/2006 | |
| KR | 10-0584957 | | 5/2006 | |
| KR | 10-2007-0068786 | | 7/2007 | |
| KR | 10-1527200 | | 6/2015 | |
| KR | 10-1643508 | | 7/2016 | |
| WO | WO-2007016599 A1 | * | 2/2007 | ............... B08B 1/10 |

* cited by examiner

*Primary Examiner* — Christopher E Mahoney
(74) *Attorney, Agent, or Firm* — CANTOR COLBURN LLP

(57) ABSTRACT

A panel inspection apparatus includes an inspection zone including an inlet through which a display panel is input, an outlet through which the display panel is discharged, and an inspection line extending from the inlet to the outlet through which the display panel is moved, a return zone including a return line extending to the inlet of the inspection zone, a panel carrier on which the display panel is seated, moving from the inlet of the inspection zone to the outlet, and returning from the outlet to the inlet through the return line, and a cleaning part located in the return zone and cleaning the panel carrier in the return line.

20 Claims, 6 Drawing Sheets

PANEL INSPECTION APPARATUS

CROSS-REFERENCE TO RELATED APPLICATION(S)

This application claims priority to and the benefit of Korean Patent Application No. 10-2023-0046297 under 35 USC § 119, filed on Apr. 7, 2023, at the Korean Intellectual Property Office (KIPO), the entire contents of which are incorporated herein by reference.

BACKGROUND

1. Technical Field

The disclosure relates to a panel inspection apparatus.

2. Description of the Related Art

A display panel is a panel for displaying an image, and is a liquid crystal display device (LCD), field emission display device (FED), electrophoretic display device (EPD), electro wetting display device (EWD), organic light emitting display device (OLED), quantum dot display device (QD), and the like.

A display panel includes a display unit for displaying an image and a driving unit connected to the display unit.

A conventional panel inspection apparatus is a device for checking whether a display panel is operating normally connected to a driving unit of the display panel.

A conventional panel inspection apparatus includes a carrier on which a display panel is seated, a contact pad connected to a driving part of a display panel, and a contact unit in contact with a contact pad of the carrier.

However, a conventional panel inspection apparatus has a problem wherein particles are generated from each of a contact pad and a contact pin by contacting each other, and a contact issue between a contact pad and a contact pin are generated.

SUMMARY

Embodiments are intended to automatically clean at least one of a contact pad and a contact pin, which are inspection means during display panel inspection, to provide a panel inspection apparatus for improved display panel inspection efficiency.

According to an embodiment, a panel inspection apparatus may include an inspection zone including an inlet into which a display panel is input, an outlet through which the display panel is discharged, and an inspection line extending from the inlet to the outlet to which the display panel is moved, a return zone including a return line extending from the outlet of the inspection zone to the inlet of the inspection zone, a panel carrier on which the display panel is seated moving from the inlet of the inspection zone to the outlet, and returning from the outlet to the inlet through the return line, and a cleaning part positioned in the return zone and cleaning the panel carrier in the return line.

The panel inspection apparatus may further include a contact part positioned in the inspection zone, in contact with the panel carrier for inspection of the display panel.

The panel carrier may include a contact pad connected to the display panel and in contact with the contact part.

The cleaning part may include a first cleaning part in contact with the contact pad to clean the contact pad.

The cleaning part may further include a first moving portion for moving the first cleaning part in a plurality of axes.

The cleaning part may further include a first recovery portion for collecting particles that have been removed from the contact pad.

The cleaning part may further include a first monitoring part for confirming state of the contact pad.

The panel inspection apparatus may further include a cleaning carrier that moves from the inlet of the inspection zone to the outlet, returns from the outlet through the return line to the inlet, and cleans the contact part.

The contact part may include a contact pin in contact with the panel carrier.

The cleaning carrier may include a second cleaning part in contact with the contact pin to clean the contact pin.

The contact part may further include a second moving portion for moving the contact pin in a plurality of axes.

The cleaning carrier may further include a second recovery portion for collecting particles that have been removed from the contact pin.

The cleaning carrier may further include a second monitoring part for confirming state of the contact pin.

The cleaning part may clean the cleaning carrier in the return line.

According to an embodiment, a panel inspection apparatus may include an inspection zone including an inlet into which a display panel is input, an outlet through which the display panel is discharged, and an inspection line extending from the inlet to the outlet to which the display panel is moved, a return zone including a return line extending from the outlet of the inspection zone to the inlet of the inspection zone, a panel carrier on which the display panel is seated moving from the inlet of the inspection zone to the outlet, and returning from the outlet to the inlet through the return line, a contact part positioned in the inspection zone and in contact with the panel carrier for inspection of the display panel, and a cleaning carrier moving from the inlet of the inspection zone to the outlet, returning from the outlet to the inlet through the return line, and cleaning the contact part.

The contact part may include a contact pin in contact with the panel carrier.

The panel carrier may include a contact pad connected to the display panel and in contact with the contact pin of the contact part.

The panel inspection apparatus may further include a cleaning part positioned in the return zone and cleaning the contact pad of the panel carrier in the return line.

The cleaning part may include a first cleaning part in contact with the contact pad to clean the contact pad.

The cleaning carrier may include a second cleaning part in contact with the contact pin to clean the contact pin.

According to embodiments, a panel inspection apparatus for improving display panel inspection efficiency is provided by automatically cleaning at least one of a contact pad and a contact pin, which are inspection means during display panel inspection.

DETAILED DESCRIPTION OF THE EMBODIMENTS

Figure 1:
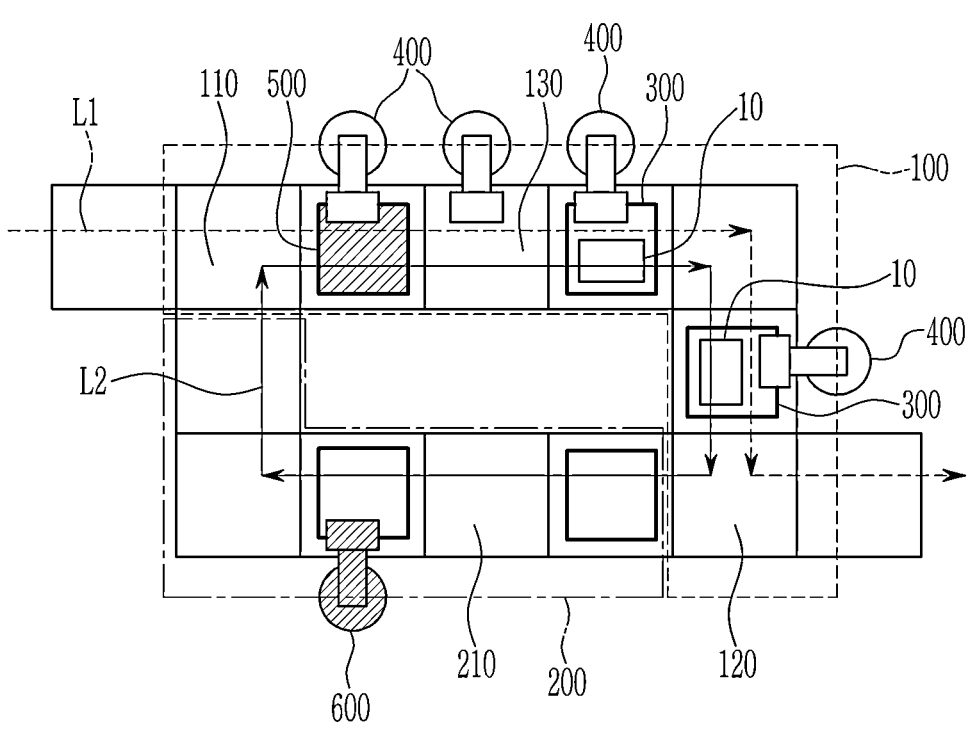
FIG. 1 is a top plan view illustrating a panel inspection apparatus according to an embodiment.

Hereinafter, various embodiments of the disclosure will be described in detail with reference to the accompanying drawings so that a skilled artisan could readily carry out the disclosure.

The disclosure may be embodied in many different forms, and is not limited to the embodiments set forth herein.

In order to clearly describe the disclosure, parts irrelevant to the description are omitted, and the same reference numerals are assigned to the same or similar constituent elements throughout the specification.

In addition, the size and thickness of each configuration shown in the drawings are arbitrarily shown for convenience of description, and the disclosure is not necessarily limited to those shown.

In the drawings, the thickness of layers, films, panels, regions, etc., are exaggerated for clarity.

And in the drawings, for convenience of description, the thickness of some layers and areas is exaggerated.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a panel inspection apparatus according to an embodiment will be described with reference to FIG. 1 to FIG. 6.

The panel inspection apparatus may include an apparatus for applying a signal to the display panel to check whether the display panel is operating normally, but the disclosure is not limited thereto, and in another embodiment, the panel inspection apparatus may include an apparatus for inspecting the display panel through a panel carrier on which the display panel is seated.

FIG. 1 is a top plan view illustrating a panel inspection apparatus according to an embodiment.

Referring to FIG. 1, the panel inspection apparatus according to an embodiment may inspect the display panel 10 by applying a signal to the display panel 10 through the panel carrier 300 on which the display panel 10 is seated.

The panel inspection apparatus may include an inspection zone 100, a return zone 200, a panel carrier 300, a contact part 400, a cleaning carrier 500, and a cleaning part 600.

The inspection zone 100 may be a region where the display panel 10 is inspected, and may be a region through which the display panel 10 passes.

The inspection zone 100 may include an inlet 110, an outlet 120, and an inspection line 130.

The inlet 110 may be a part into which the display panel 10 is put, and the display panel 10 may be put into the inlet 110 using various panel input means such as a robot arm or a cassette.

The display panel 10 inserted through the inlet 110 may be seated on the panel carrier 300 and connected to a contact pad of the panel carrier 300.

Various driving parts of the display panel 10 may be connected to the contact pad of the panel carrier 300.

The outlet 120 may be a portion from which the display panel 10 is discharged, and the display panel 10 may be discharged to various following processes through the outlet 120 using various panel ejection means such as a robot arm or cassette.

The display panel 10 input into the inlet 110 and seated in the panel carrier 300 may be inspected by the contact part 400 through the inspection line 130 and discharged to the next process through the outlet 120.

The inspection line 130 may extend from the inlet 110 to the outlet 120 to move the panel carrier 300 and the cleaning carrier 500 in which the display panel 10 input from the inlet 110 is seated.

The inspection line 130 may include various carrier means of movement, such as a belt conveyor, and the panel carrier 300 on which the display panel 10 is seated through the inspection line 130 may be moved from the inlet 110 to the outlet 120.

The display panel 10 seated on the panel carrier 300 may be moved through the first line L1, sequentially connecting the inlet 110, the inspection line 130, and the outlet 120 of the inspection zone 100, but the disclosure is not limited thereto.

The return zone 200 may be a region in which the panel carrier 300 and the cleaning carrier 500 return from the outlet 120 of the inspection zone 100 to the inlet 110.

The return zone 200 may include a return line 210.

The return line 210 may extend from the outlet 120 of the inspection zone 100 to the inlet 110 to move the panel carrier 300 and the cleaning carrier 500 from which the display panel 10 is discharged from the outlet 120.

The return line 210 may include various carrier means of movement, such as a belt conveyor, and the panel carrier 300 and the cleaning carrier 500, and the display panel 10 may be discharged through the return line 210 and moved from the outlet 120 to the inlet 110.

The panel carrier 300 may pass through the second line L2 that sequentially connects the return line 210, the inlet 110, the inspection line 130, the outlet 120, and the return line 210 of the return zone 200, and the cleaning carrier 500 may circulate through the inspection zone 100 and the return zone 200, but the disclosure is not limited thereto.

The return zone 200 and the inspection zone 100 may be connected to each other in the form of a square loop in plan area, but are not limited thereto, and the return zone 200 and the inspection zone 100 may be connected to each other in various closed-loop shapes such as a triangular loop, a pentagonal loop, a hexagonal loop, a polygonal loop, a circular loop, and an oval loop.

Figure 2:
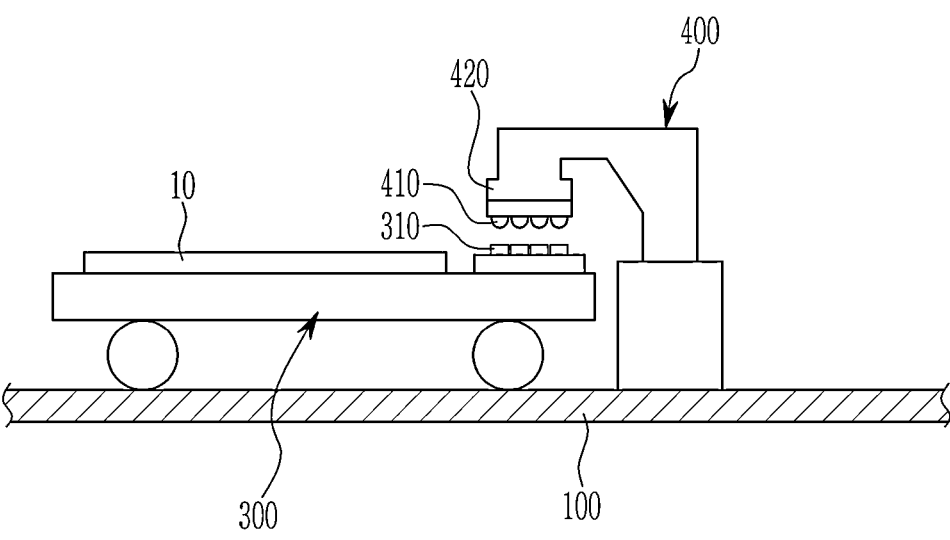
FIG. 2 is a side view illustrating a panel carrier and a contact part in an inspection zone of a panel inspection apparatus according to an embodiment.

FIG. 2 is a side view illustrating a panel carrier and a contact part in an inspection zone of a panel inspection apparatus according to an embodiment.

Referring to FIG. 1 and FIG. 2, the display panel 10 may be seated on the panel carrier 300 at the inlet 110 of the inspection zone 100, the panel carrier 300 may move from the inlet 110 of the inspection zone 100 to the outlet 120 of the inspection zone 100, and after the display panel 10 is discharged from the outlet 120, the panel carrier 300 may return from the outlet 120 to the inlet 110 through the return line 210.

The panel carrier 300 may include a contact pad 310 connected to various driving parts of the display panel 10.

The contact pad 310 may include multiple contact pads.

The contact pad 310 of the panel carrier 300 connected to the display panel 10 may contact the contact part 400 in the inspection zone 100, and it is possible to check whether the display panel 10 is operating normally by using the transmitted signal from the contact part 400 through the contact pad 310.

The contact pad 310 of the panel carrier 300 on which a display panel 10 is seated in the inlet 110 of the inspection zone 100 may pass through the inspection line 130 of the inspection zone 100, and the contact pad 310 of the panel carrier 300 from which the display panel 10 is discharged from the outlet 120 of the inspection zone 100 may pass through the return line 210 of the return zone 200 while being cleaned by the cleaning part 600.

Another display panel 10 may be seated on the panel carrier 300 at the inlet 110 of the inspection zone 100 after the contact pad 310 is cleaned by the cleaning part 600 through the return line 210 of the return zone 200.

The panel carrier 300 may include multiple panel carriers 300, and the panel carriers 300 may sequentially move along the second line L2.

The cleaning carrier 500 may be positioned between the neighboring panel carriers 300 among the panel carriers 300, but is not limited thereto.

The contact part 400 may be positioned in the inspection zone 100, and the display panel 10 may be in contact with the contact pad 310 of the panel carrier 300 in which the display panel 10 is seated for inspection of the display panel 10, and a test signal may be transmitted to the display panel 10.

The contact part 400 may include a contact pin 410 and a second moving part 420.

The contact pins 410 may come into contact with the contact pads 310 of the panel carrier 300 and may be moved in multiple axes by the second moving part 420 to come into contact with the contact pads 310.

The contact pin 410 may include multiple contact pins.

The contact pins 410 may come into contact with the contact pads 310 of the panel carrier 300 on which the display panel 10 is seated, and from the contact pins 410 of the contact part 400 through the contact pads 310 to the display panel, a test signal may be transmitted to the display panel 10.

The second moving part 420 may support the contact pin 410, and may move the contact pin 410 in multiple axes.

The axes may include, but are not limited to, a first direction, a second direction intersecting the first direction, a third direction intersecting the first and second directions, and a fourth direction intersecting the first, second, and third directions.

The second moving part 420 may include multiaxial means such as various robot arms.

The contact pin 410 of the contact part 400 may contact the contact pad 310 of the panel carrier 300 through the inspection line 130, may transmit the test signal to the display panel 10 through the contact pad 310 of the panel carrier 300, and may be cleaned by the cleaning carrier 500 adjacent to the panel carrier 300.

In case that the contact pin 410 of the contact part 400 is cleaned by the cleaning carrier 500, the second moving part 420 may move the contact pin 410 in multiple axes to clean the contact pin 410 and the cleaning carrier 500 by increasing the pressure and contact area between the carrier 500, and the cleaning force of the cleaning carrier 500 with respect to the contact pin 410 may be improved.

The contact part 400 may include multiple contact parts 400, and the contact parts 400 may be sequentially disposed along the inspection line 130.

Each of the contact parts 400 may perform the same test or different tests on the display panel 10, but is not limited thereto.

Figure 3:
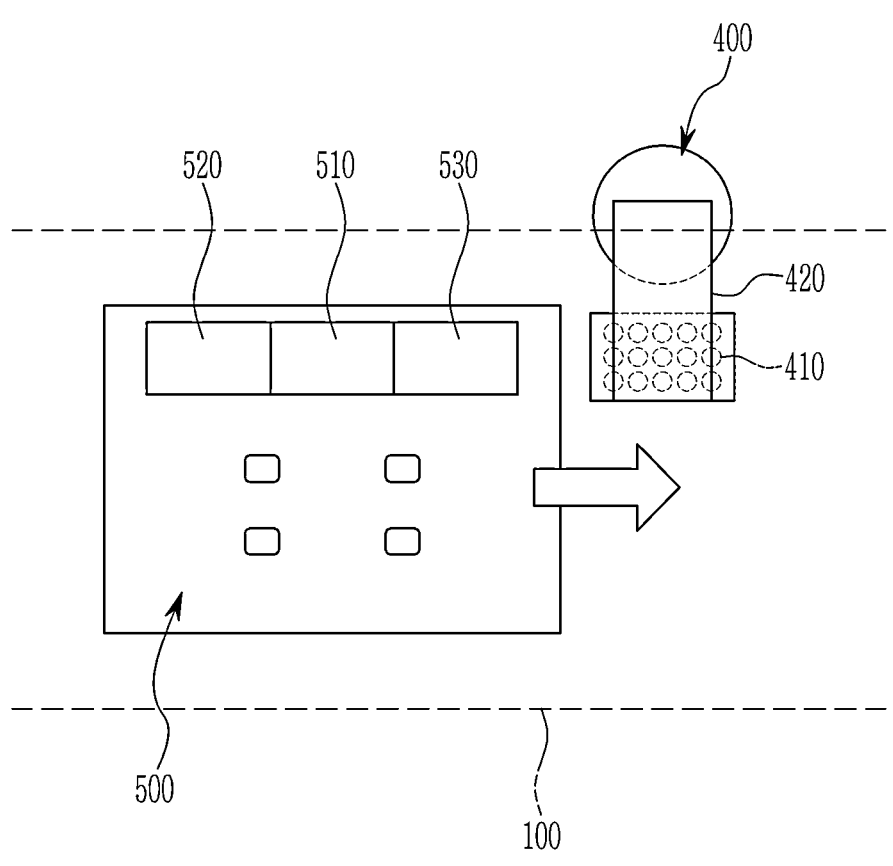
FIG. 3 is a top plan illustrating a cleaning carrier and a contact part in the inspection zone of the panel inspection apparatus according to an embodiment.

FIG. 3 is a top plan view illustrating a cleaning carrier and a contact part in an inspection zone of a panel inspection apparatus according to an embodiment.

Figure 4:
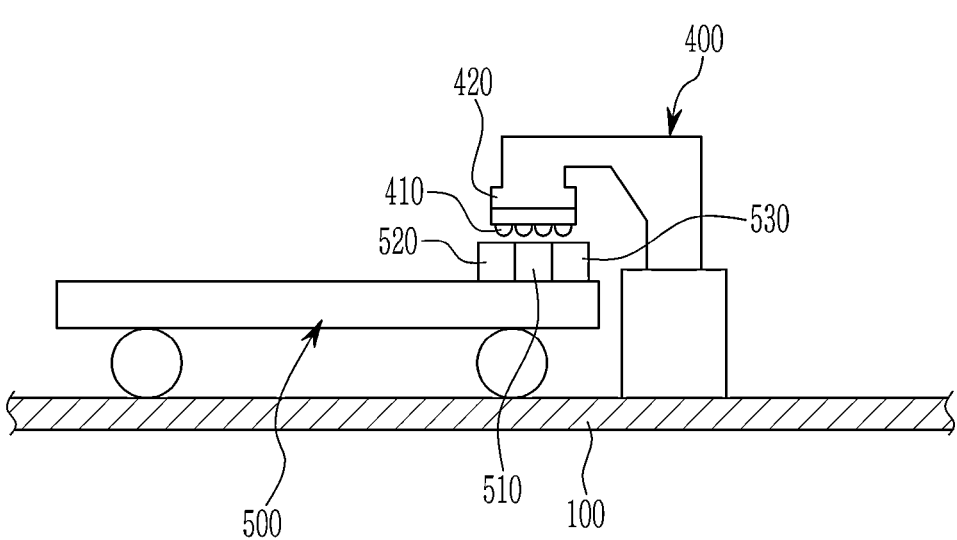
FIG. 4 is a side view illustrating a cleaning carrier and a contact part in an inspection zone of a panel inspection apparatus according to an embodiment.

FIG. 4 is a side view illustrating a cleaning carrier and a contact part in an inspection zone of a panel inspection apparatus according to an embodiment.

FIG. 3 and FIG. 4, referring to FIG. 1, show that the cleaning carrier 500 moves from the inlet 110 of the inspection zone 100 to the outlet 120, and returns from the outlet 120 to the inlet 110 through the return line 210.

The cleaning carrier 500 may clean the contact part 400 while passing through the inspection line 130 of the inspection zone 100.

The cleaning carrier 500 may include a second cleaning part 510, a second recovery part 520, and a second monitoring part 530.

The second cleaning part 510 may come into contact with the contact pin 410 of the contact part 400 and may clean the contact pin 410.

The second cleaning part 510 may include various cleaning means such as a brush, a wiper, ethanol, a microfiber cloth, an air gun, and a laser beam.

The second cleaning part 510 may clean the contact pin 410 of the contact part 400 to separate particles attached to the contact pin 410 from the contact pin 410.

The particles attached to the contact pin 410 of the contact part 400 may be particles generated in case that the contact pin 410 contacts the contact pad 310 of the panel carrier 300, but are not limited thereto.

In case that the contact pin 410 of the contact part 400 is cleaned by the second cleaning part 510 of the cleaning carrier 500, the second moving part 420 of the contact part 400 may move the contact pin 410 in multiple axes to increase the pressure and contact area between the contact pin 410 and the second cleaning part 510.

The second recovery part 520 may be disposed adjacent to the second cleaning part 510 and may collect particles separated from the contact pin 410 by the second cleaning part 510.

The second recovery part 520 may include various particle recovery means such as an air inhalation unit.

The second monitoring part 530 may be disposed adjacent to the second cleaning part 510 and may check the state of the contact pin 410 of the contact part 400.

The second monitoring part 530 may include various monitoring means such as cameras and sensors.

The second monitoring part 530 may check the resistance and surface condition of the contact pin 410 to check the comprehensive state of the contact pin 410.

Based on the state of the contact pin 410 monitored by the second monitoring part 530, cleaning of the contact pin 410 using the cleaning carrier 500 may be performed, but is not limited thereto.

Figure 5:
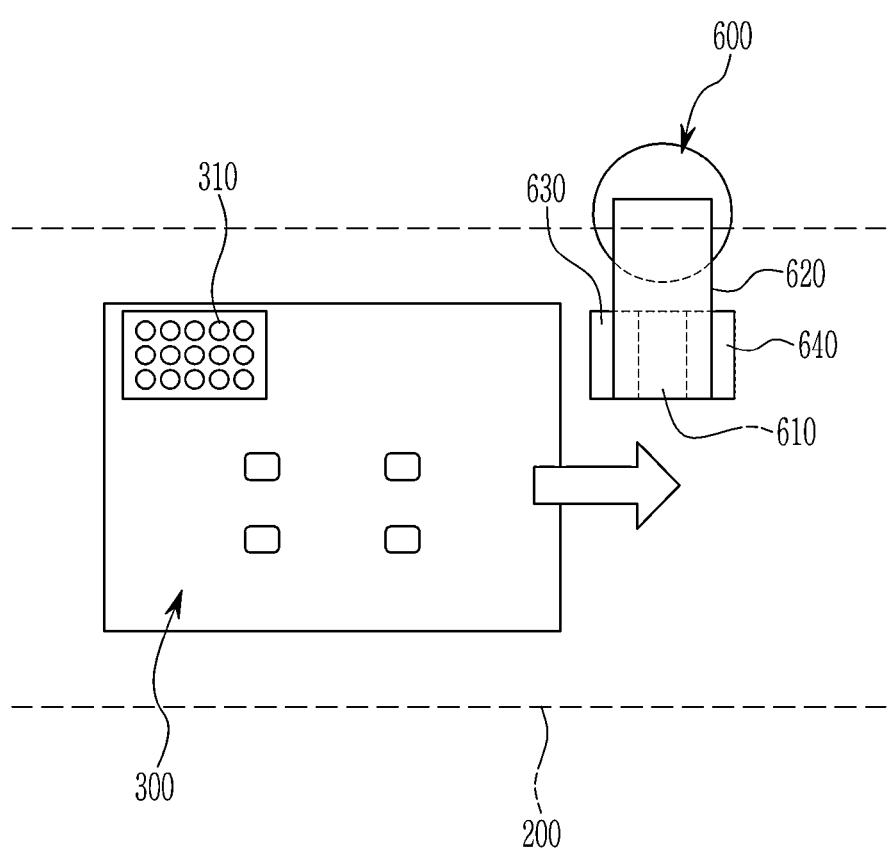
FIG. 5 is a top plan view illustrating a panel carrier and a cleaning part in a return zone of a panel inspection apparatus according to an embodiment.

FIG. 5 is a top plan view illustrating a panel carrier and a cleaning part in the return zone of the panel inspection apparatus according to an embodiment.

Figure 6:
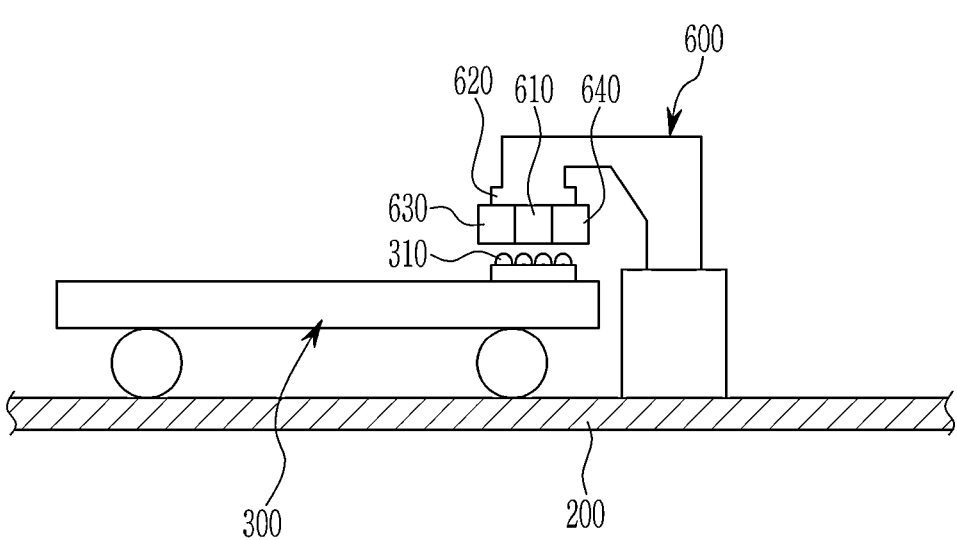
FIG. 6 is a side view illustrating a panel carrier and a cleaning part in a return zone of a panel inspection apparatus according to an embodiment.

FIG. 6 is a side view illustrating a panel carrier and a cleaning part in the return zone of the panel inspection apparatus according to an embodiment.

FIG. 5 and FIG. 6, referring to FIG. 1, show that the cleaning part 600 is positioned in the return zone 200, and after the display panel 10 is discharged from the outlet 120 of the inspection zone 100, the panel carrier 300 through the return line 210 of the return zone 200 is cleaned.

The cleaning part 600 may contact the panel carrier 300 through the return line 210 to clean the contact pad 310 of the panel carrier 300.

The cleaning part 600 may include a first cleaning part 610, a first moving part 620, a first recovery part 630, and a first monitoring part 640.

The first cleaning part 610 may clean the contact pad 310, in contact with the contact pad 310 of the panel carrier 300.

The first cleaning part 610 may include various cleaning means such as a brush, a wiper, ethanol, a microfiber cloth, an air gun, and a laser beam.

The first cleaning part 610 may clean the contact pad 310 of the panel carrier 300 to release particles attached to the contact pad 310 from the contact pad 310.

The particles attached to the contact pad 310 of the panel carrier 300 may be particles generated in case that the contact pin 410 of the contact part 400 contacts the contact pad 310, but are not limited thereto.

In case that the contact pad 310 of the panel carrier 300 is cleaned by the first cleaning part 610 of the cleaning part 600, the first moving part 620 of the cleaning part 600 may move the first cleaning part 610 in multiple axes to increase the pressure and contact area between the contact pad 310 and the first cleaning part 610, thereby improving the cleaning force of the first cleaning part 610 of the cleaning part 600 relative to the contact pad 310 of the panel carrier 300.

The first moving part 620 may support the first cleaning part 610 and may move the first cleaning part 610 in multiple axes.

The axes may include a first direction, a second direction crossing a first direction, a first direction crossing a first direction, a third direction crossing a second direction, and a fourth direction crossing a first direction, a second direction, and a third direction, but are not limited thereto.

The first moving part 620 may include a multi-axis moving means such as various robot arms.

In case that the contact pad 310 of the panel carrier 300 is cleaned by the first cleaning part 610, the first moving part 620 may move the first cleaning part 610 in multiple axes to increase the pressure and contact area between the contact pad 310 and the first cleaning part 610, and the cleaning power of the first cleaning portion 610 with respect to the contact pad 310 may be improved.

The first recovery part 630 may be disposed adjacent to the first cleaning part 610 and may collect particles separated from the contact pad 310 by the first cleaning part 610.

The first recovery part 630 may include various particle recovery means such as an air inhalation unit.

The first monitoring part 640 may be disposed adjacent to the first cleaning part 610 and may check the state of the contact pad 310 of the panel carrier 300.

The first monitoring part 640 may include various monitoring means such as cameras and sensors.

The first monitoring part 640 may check the overall condition of the contact pad 310 by checking the resistance and surface condition of the contact pad 310.

Based on the state of the contact pad 310 monitored by the first monitoring part 640, cleaning of the contact pad 310 using the cleaning part 600 may be performed, but is not limited thereto.

In another embodiment, the cleaning part 600 may clean the cleaning carrier 500 through the return line 210 of the return zone 200.

For example, the first cleaning part 610 of the cleaning part 600 may contact the second cleaning part 510 of the cleaning carrier 500 through the return line 210 to clean the second cleaning part 510.

In another embodiment, the panel inspection apparatus may include an inspection zone 100, a return zone 200, a panel carrier 300, and a cleaning part 600.

For example, the cleaning part 600 may clean the panel carrier 300 passing through the return zone 200.

In another embodiment, the panel inspection apparatus may include an inspection zone 100, a return zone 200, a panel carrier 300, a contact part 400, and a cleaning carrier 500.

For example, the cleaning carrier 500 may clean the contact part 400 while passing through the inspection zone 100.

The panel inspection apparatus may include an inspection zone 100, a return zone 200, a panel carrier 300, a contact part 400, a cleaning carrier 500, and a cleaning part 600, so that while inspecting the display panel 10 seated on the panel carrier 300 through the inspection zone 100 using the contact part 400, particles generated on each of the contact pins 410 and the contact pads 310 of the panel carrier 300 may be cleaned by the cleaning carrier 500 through the inspection zone 100 and the cleaning part 600 positioned in the return zone 200.

As a result, the panel inspection apparatus may clean the contact pin 410 and the contact pad 310, which are inspection means, during facility operation, thereby improving the facility utilization rate and simultaneously, the contact pin 410 and the contact pad 310, which are inspection means, and since time and cost required for cleaning and replacement are reduced, inspection efficiency for the display panel 10 may be improved.

For example, a panel inspection apparatus for improving inspection efficiency for the display panel 10 is provided by automatically cleaning at least one of the contact pad 310 and the contact pin 410, which are inspection means during inspection of the display panel 10.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A panel inspection apparatus, comprising:
an inspection zone comprising an inlet into which a display panel is input, an outlet through which the display panel is discharged, and an inspection line extending from the inlet to the outlet to which the display panel is moved;
a return zone comprising a return line extending from the outlet of the inspection zone to the inlet of the inspection zone;
a panel carrier on which the display panel is seated moving from the inlet of the inspection zone to the outlet, and returning from the outlet to the inlet through the return line; and
a cleaning part positioned in the return zone and cleaning the panel carrier in the return line.

2. The panel inspection apparatus of claim 1, further comprising a contact part positioned in the inspection zone, in contact with the panel carrier for inspection of the display panel.

3. The panel inspection apparatus of claim 2, wherein the panel carrier comprises a contact pad connected to the display panel and in contact with the contact part.

4. The panel inspection apparatus of claim 3, wherein the cleaning part comprises a first cleaning part in contact with the contact pad to clean the contact pad.

5. The panel inspection apparatus of claim 4, wherein the cleaning part further comprises a first moving portion for moving the first cleaning part in a plurality of axes.

6. The panel inspection apparatus of claim 4, wherein the cleaning part further comprises a first recovery portion for collecting particles that have been removed from the contact pad.

7. The panel inspection apparatus of claim 4, wherein the cleaning part further comprises a first monitoring part for confirming state of the contact pad.

8. The panel inspection apparatus of claim 2, further comprising:
a cleaning carrier that moves from the inlet of the inspection zone to the outlet, returns from the outlet through the return line to the inlet, and cleans the contact part.

9. The panel inspection apparatus of claim 8, wherein the contact part comprises a contact pin in contact with the panel carrier.

10. The panel inspection apparatus of claim 9, wherein the cleaning carrier comprises a second cleaning part in contact with the contact pin to clean the contact pin.

11. The panel inspection apparatus of claim 9, wherein the contact part further comprises a second moving portion for moving the contact pin in a plurality of axes.

12. The panel inspection apparatus of claim 10, wherein the cleaning carrier further comprises a second recovery portion for collecting particles that have been removed from the contact pin.

13. The panel inspection apparatus of claim 10, wherein the cleaning carrier further comprises a second monitoring part for confirming state of the contact pin.

14. The panel inspection apparatus of claim 8, wherein the cleaning part cleans the cleaning carrier in the return line.

15. A panel inspection apparatus, comprising:
an inspection zone comprising an inlet into which a display panel is input, an outlet through which the display panel is discharged, and an inspection line extending from the inlet to the outlet to which the display panel is moved;
a return zone comprising a return line extending from the outlet of the inspection zone to the inlet of the inspection zone;
a panel carrier on which the display panel is seated moving from the inlet of the inspection zone to the outlet, and returning from the outlet to the inlet through the return line;
a contact part positioned in the inspection zone and in contact with the panel carrier for inspection of the display panel; and
a cleaning carrier moving from the inlet of the inspection zone to the outlet, returning from the outlet to the inlet through the return line, and cleaning the contact part.

16. The panel inspection apparatus of claim 15, wherein the contact part comprises a contact pin in contact with the panel carrier.

17. The panel inspection apparatus of claim 16, wherein the panel carrier comprises a contact pad connected to the display panel and in contact with the contact pin of the contact part.

18. The panel inspection apparatus of claim 17, further comprising:
a cleaning part positioned in the return zone and cleaning the contact pad of the panel carrier in the return line.

19. The panel inspection apparatus of claim 18, wherein the cleaning part comprises a first cleaning part in contact with the contact pad to clean the contact pad.

20. The panel inspection apparatus of claim 16, wherein the cleaning carrier comprises a second cleaning part in contact with the contact pin to clean the contact pin.

\* \* \* \* \*